United States Patent [19]
Narui et al.

[11] Patent Number: 5,383,215
[45] Date of Patent: Jan. 17, 1995

[54] SEMICONDUCTOR LASER WHICH HAS A (100) TOP SURFACE AND A STRIPE RIDGE WHICH EXTENDS IN THE HORIZONTAL <01-1> AXIS DIRECTION AND HAS SIDE WALL SURFACES (110) AND A TRIANGULAR REGION BETWEEN (111) FACES

[75] Inventors: Hironobu Narui; Daisuke Imanishi, both of Kanagawa, Japan

[73] Assignee: Sony Corporation, Tokyo, Japan

[21] Appl. No.: 103,799

[22] Filed: Aug. 10, 1993

[30] Foreign Application Priority Data

Aug. 25, 1992 [JP] Japan .................. 4-225992

[51] Int. Cl.⁶ ............................................. H01S 3/19
[52] U.S. Cl. ......................................... 372/46; 372/45; 372/48
[58] Field of Search ................... 372/45, 46, 48, 43; 437/93

[56] References Cited

U.S. PATENT DOCUMENTS

| | | | |
|---|---|---|---|
| 4,108,685 | 8/1978 | Chang et al. | 437/14 |
| 4,429,397 | 1/1984 | Sugimoto et al. | 372/46 |
| 5,111,469 | 5/1992 | Narui et al. | 372/46 |
| 5,255,280 | 10/1993 | Harui et al. | 372/46 |

FOREIGN PATENT DOCUMENTS

| | | | |
|---|---|---|---|
| 4111376 | 4/1992 | Japan | 372/46 |
| 4-326786 | 11/1992 | Japan | 372/46 |
| 5-55692 | 3/1993 | Japan | 372/46 |

*Primary Examiner*—Rodney B. Bovernick
*Assistant Examiner*—Hemang Sunghavi

[57] ABSTRACT

An SDH semiconductor laser has a semiconductor substrate which is (100) oriented and has a stripe ridge thereon, first and second cladding layers disposed on stripe ridge, an active layer sandwiched between the first and second cladding layers, and an electrode held in electric contact with the first and second cladding layers and the active layer. The stripe ridge extends in a <01-1> axis direction, and the first and second cladding layers and the active layer jointly provide a semiconductor stripe region of triangular cross section sandwiched between (111) A faces. A method of manufacturing the SDH semiconductor laser is also disclosed.

2 Claims, 2 Drawing Sheets

SEMICONDUCTOR LASER WHICH HAS A (100) TOP SURFACE AND A STRIPE RIDGE WHICH EXTENDS IN THE HORIZONTAL <01-1> AXIS DIRECTION AND HAS SIDE WALL SURFACES (110) AND A TRIANGULAR REGION BETWEEN (111) FACES

BACKGROUND OF THE INVENTION

1. Field of the Invention

The present invention relates to a semiconductor laser and a method of manufacturing such a semiconductor laser, and more particularly to an SDH (Separated Double Hetero junction) semiconductor laser and a method of manufacturing such an SDH semiconductor laser.

2. Description of the Related Art

One SDH semiconductor laser having a low threshold current Ith and an active layer defined by being separated from other layers by a particular crystal that is produced upon epitaxial growth is proposed in Japanese laid-open patent publication No. 61-183987, for example.

Another SDH semiconductor laser is also proposed in Japanese laid-open patent publication No. 2-174287. FIG. 1 of the accompanying drawings schematically shows such a proposed SDH semiconductor laser. As shown in FIG. 1, the SDH semiconductor laser has a GaAs substrate 2 which is (100) oriented and has a stripe ridge 1 disposed on its (100) principal face and extending along a <011> direction, i.e., along an inverse mesa structure. The SDH semiconductor layer 4, a second cladding layer 32, and a current block layer 5 that are successively deposited by way of epitaxial growth on the GaAs substrate 2 including the stripe ridge 1. On the stripe ridge 1, there is formed a semiconductor stripe region 6 of triangular cross section that is sandwiched between (111) B crystal faces and dislocated from other regions. The active layer 4 in the semiconductor stripe region 6 is separate from the active layer 4 in the other regions, and the current block layer 5 is located on opposite sides of the semiconductor strip region 6 and held in contact with opposite sides of the active layer 4 in the semiconductor stripe region 6. The current block layer 5 is positioned near the vertex of the triangular semiconductor stripe region 6.

The SDH semiconductor laser is fabricated by an epitaxial growth process according to methyl MOCVD (metal organic chemical vapor deposition). The SDH semiconductor laser is fabricated utilizing such a feature of the methyl MOCVD that the rate of epitaxial growth on the (111) B crystal faces is much higher than other growth rates.

More specifically, the stripe ridge 1 shown in FIG. 1 has the (100) face on its upper surface and its opposite side edges extending along the <011> direction. As the epitaxial growth of the layers shown in FIG. 1 progresses, therefore, (111) faces are developed from the opposite side edges of the stripe ridge 1 upon epitaxial growth thereon. Once the (111) B faces are produced, any crystal growth is substantially ceased with respect to these faces, and crystal growth subsequently occurs from the upper surface of the stripe ridge 1 and from within grooves on the opposite sides of the stripe ridge 1. Accordingly, dislocations take place at the (111) B faces on the stripe ridge 1, producing the semiconductor stripe region 6 of triangular cross section sandwiched between the (111) B regions on the stripe ridge 1.

By selecting a width for the semiconductor stripe region 6, i.e., a width for the stripe ridge 1, and thicknesses for the various layers, a limited narrow active layer 4 is formed in the semiconductor stripe region 6 and sandwiched by the current block layer 5 for thereby limiting the flow of a current into the active layer 4, resulting in a low threshold current Ith.

Then, a third cladding layer 33 and a cap layer 7 are successively deposited over the semiconductor stripe region 6 of triangular cross section by way of epitaxial growth.

However, the semiconductor surface of the semiconductor stripe region 6 often suffers surface irregularities due to hillocks which tend to increase the threshold current Ith or irregular current characteristics.

OBJECTS AND SUMMARY OF THE INVENTION

It is an object of the present invention to provide a semiconductor laser of good surface morphology free of hillocks and a method of manufacturing such a semiconductor laser.

Another object of the present invention is to provide an SDH semiconductor laser with a stable threshold current and a method of manufacturing such a semiconductor laser.

According to the present invention, there is provided a semiconductor laser comprising a semiconductor substrate which is (100) oriented and has a stripe ridge thereon, first and second cladding layers disposed on stripe ridge, an active layer sandwiched between the first and second cladding layers, and an electrode held in electric contact with the first and second cladding layers and the active layer, the stripe ridge extending in a <01-1> axis direction, the first and second cladding layers and the active layer jointly providing a region of triangular cross section sandwiched between (111) A faces.

According to the present invention, there is also provided a method of manufacturing a semiconductor laser, comprising the steps of forming a stripe ridge in a <01-1> direction on a semiconductor substrate which is (100) oriented, forming a first cladding layer, an active layer, and a second cladding layer of a methyl compound successively on the stripe ridge by way of chemical vapor deposition at a growth temperature of 800° C. or higher, the first and second cladding layers and the active layer jointly providing a region of triangular cross section sandwiched between (111) A faces, and forming an electrode in electric contact with the first and second cladding layers and the active layer.

The above and other objects, features, and advantages of the present invention will become apparent from the following description of an illustrative embodiment thereof to be read in conjunction with the accompanying drawings, in which like reference numerals represent the same or similar objects.

DETAILED DESCRIPTION OF THE PREFERRED EMBODIMENT

A semiconductor laser according to the present invention will be described below with respect to a method of manufacturing the same with reference to FIGS. 2 and 3.

An n- or p-type GaAs single-crystal substrate 12 which is (100) oriented is employed as a basis on which various layers will be deposited. A stripe ridge 11 is formed on a principal surface of the substrate 12 along an <01-1> axis direction by defining etching grooves 11E on its opposite sides by a known etching process such as a chemical etching process or an RIE (reactive ion etching) process.

Figure 2:
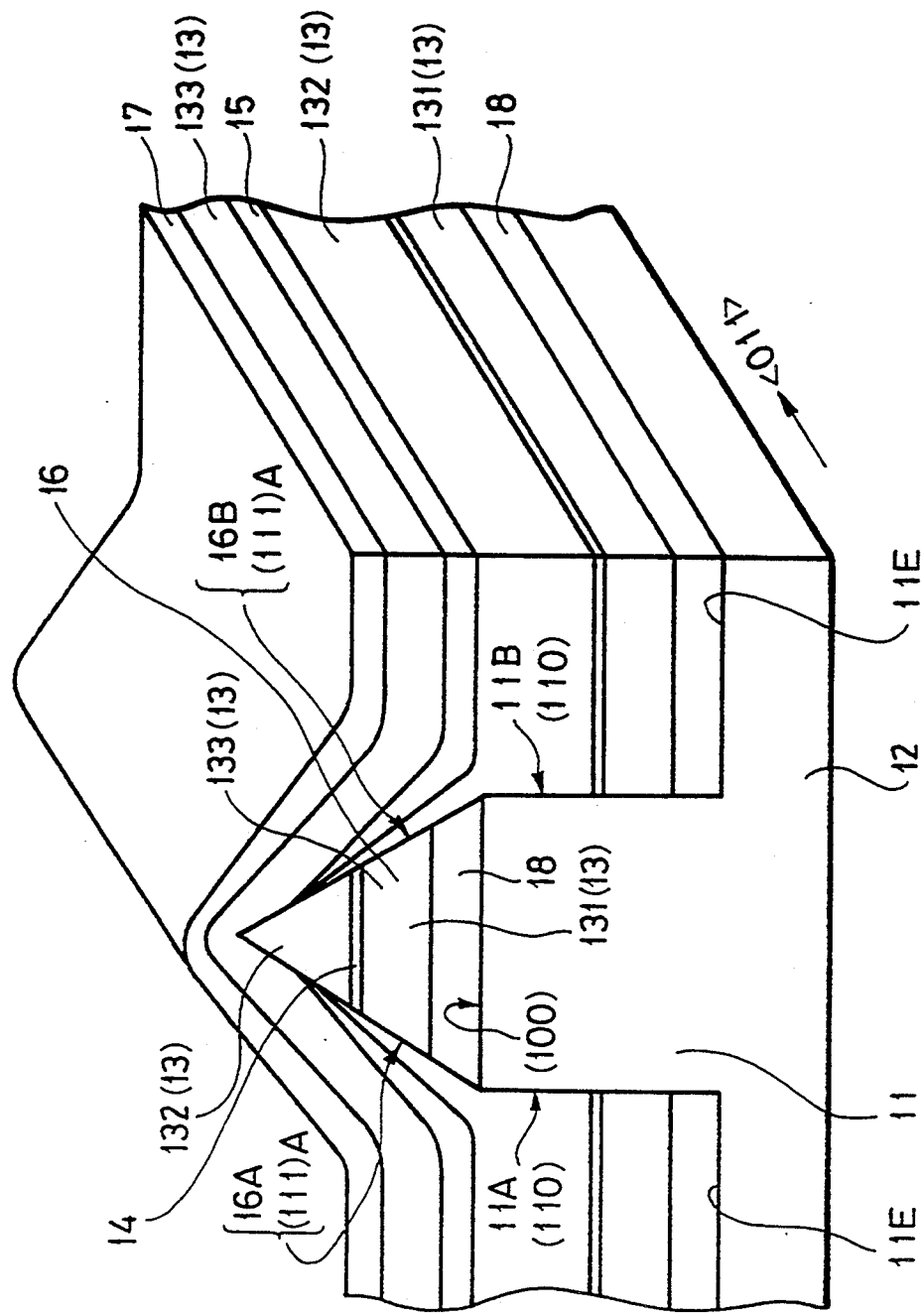
FIG. 2 is a fragmentary perspective view of a semiconductor laser according to the present invention.

The stripe ridge 11 has opposite side wall surfaces 11A, 11B which may be formed as (110) faces extending perpendicularly to the upper surface of the stripe ridge 11 as shown in FIG. 2.

Figure 1:
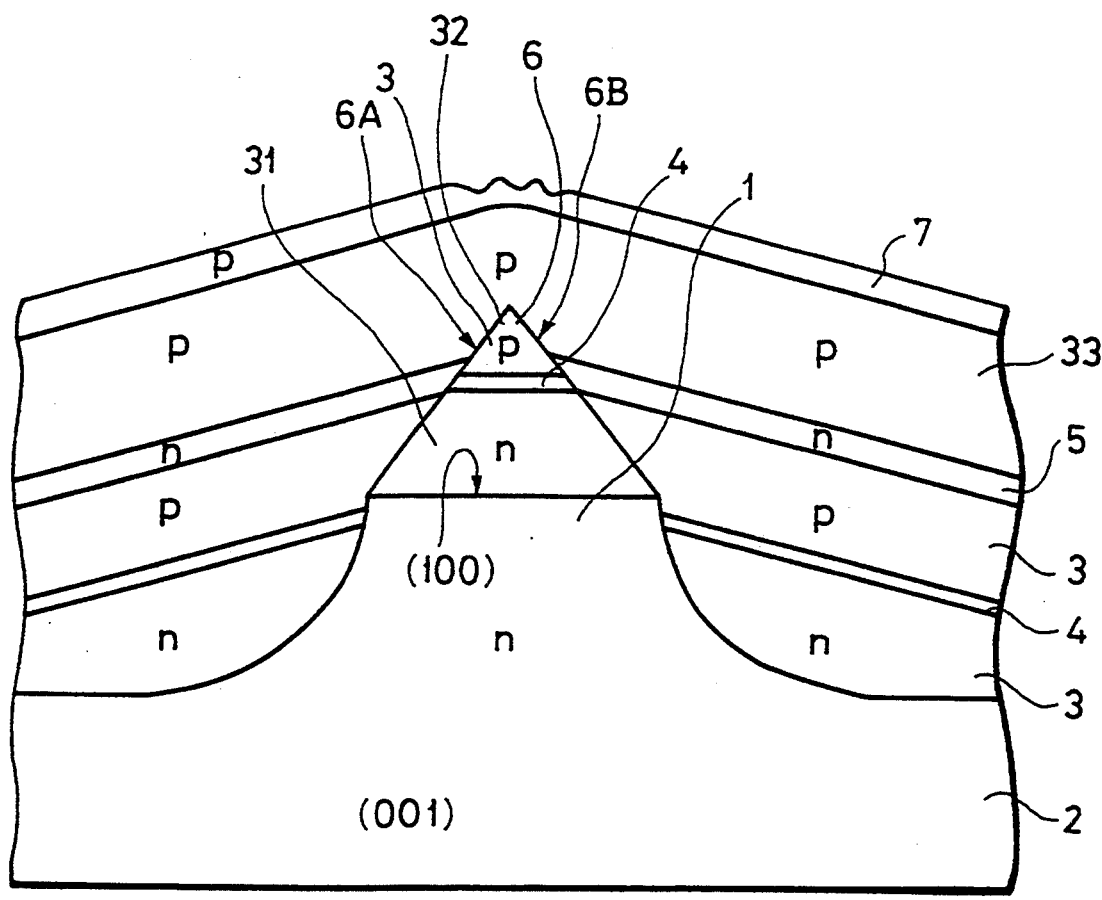
FIG. 1 is a fragmentary cross-sectional view of a conventional semiconductor laser.
Figure 3:
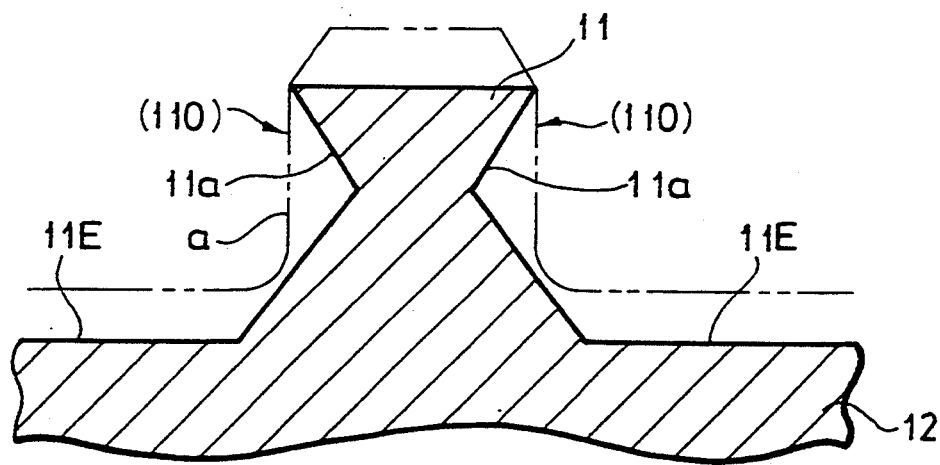
FIG. 3 is a fragmentary cross-sectional view of an alternative GaAs substrate for use in the semiconductor laser according to the present invention.

Alternatively, as shown in FIG. 3, a stripe ridge 11 having an inverse mesa structure including side wall surfaces 11a, other than the (110) faces, which are of a constricted shape, may be formed by an etching process using an etching solution which comprises a mixture of lactic acid or tartaric acid, an aqueous solution of hydrogen peroxide, and water. Even though the stripe ridge 11 has the constricted side wall surfaces 11a other than the (110) faces, the (110) faces are developed on the side walls of the stripe ridge 11 as indicated by the two-dot-and-dash line in FIG. 3 upon subsequent epitaxial growth.

Thereafter, on the GaAs substrate 12 including the stripe ridge 11, there are successively deposited an n- or p-type GaAs buffer layer 18, a first cladding layer 131 of AlGaAs of the same conductivity type as the GaAs buffer layer 18, an active layer 14 as of GaAs having a smaller band gap than the first cladding layer 131, a second cladding layer 132 of AlGaAs of the conductivity type different from the first cladding layer 131, a current block layer 15 of AlGaAs of the conductivity type different from the second cladding layer 132, a third cladding layer 133 of AlGaAs of the same conductivity type as the second cladding layer 132, and a cap layer 17 of GaAs of the same conductivity type as the third cladding layer 133, by way of epitaxial growth according to methyl MOCVD at a growth temperature, i.e., a substrate temperature of 800° C. or higher.

At this time, the above layers are grown by way of epitaxial growth in the etching grooves 11E and on the stripe ridge 11. (111) A faces grow along the opposite side edges of the stripe ridge 11. Since the growth rate of the (111) A faces is lower than the growth rate of the (100) face, and much lower than the growth rate of the (100) face particularly when the temperature at which the (111) A faces grow is 800° C. or higher, the epitaxial growth over the upper surface, i.e., the (100) face, of the stripe ridge 11 virtually stops at the time the (111) A faces that have been grown along the opposite side edges of the stripe ridge 11 cross each other. As a result, a semiconductor stripe region 16 sandwiched between these (111) A faces is formed on the stripe ridge 11 along the stripe ridge 11.

A portion of the active layer 14 which is grown on the stripe ridge 11 is separated from portions of the active layer 14 in the etching grooves 11E by selecting a depth for the etching grooves 11E, i.e., a height for the stripe ridge 11, a width for the stripe ridge 11, and thicknesses for the layers 18, 131, 14, 132, 15, 133, 17. In the semiconductor stripe region 16 sandwiched between slanted surfaces 16A, 16B formed by the (111) A faces, only the buffer layer 18, the first cladding layer 131, the active layer 14, and the second cladding layer 132 are separated from those layers in the other regions than the semiconductor stripe region 16.

While the semiconductor stripe region 16 of a triangular cross section is produced on the stripe ridge 11 by the slanted surfaces 16A, 16B formed by the (111) A faces, the epitaxial growth primarily from the etching grooves 11E develops progressively. The current block layer 15, in particular, is positioned in contact with the ends of the active layer 14 in the semiconductor stripe region 16 that are located on the slanted surfaces 16A, 16B, or with the ends of the second cladding layer 132 in the semiconductor stripe region 16 as shown in FIG. 2.

The third cladding layer 133 and the cap layer 17 are of thicknesses large enough to lie astride the vertex of the semiconductor stripe region 16.

An electrode is connected to the cap layer 17 in ohmic contact therewith, and another electrode is connected to the reverse side of the GaAs substrate 12.

When an electric current flows between the electrodes, the current flows into the active layer 14 as an operating region in the semiconductor stripe region 16 which is free of the current block layer 15. The semiconductor layer, as an SDH semiconductor laser, now emits a laser beam.

With the above structure, the opposite wall surfaces 11A, 11B of the stripe ridge 11 are composed of (110) faces, or may be of an inverse mesa structure as shown in FIG. 3. As the (110) faces are grown by way of epitaxial growth, since their growth rate is lower than the growth rate of the (111) A faces, the epitaxial growth almost stops. Thereafter, epitaxial growth progresses primarily from the (100) face on the bottoms of the etching grooves 11E. Therefore, the active layer 14 and the first and second cladding layers 131, 132 between which the active layer 14 is sandwiched on the stripe bridge 11 are separated from those layers in the etching grooves 11E.

The SDH semiconductor laser of the above structure is of better surface morphology and can reliably and stably have a low threshold current Ith that is achieved by the SDH structure.

The active layer 14 in the semiconductor stripe region 16 may be formed as very thin films along the slanted surfaces 16A, 16B. The formation of such very thin films can be avoided by increasing the epitaxial growth temperature. Even when those thin films are produced, they will not serve as an operating region of the active layer because their thickness is of about several tens nm and the band gap is widened by the quantum effect.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A semiconductor laser comprising:
   a semiconductor substrate which is (100) oriented and has a stripe ridge thereon with a top surface of (100) orientation;

first and second cladding layers disposed on said stripe ridge;

an active layer sandwiched between said first and second cladding layers;

an electrode held in electric contact with said first and second cladding layers and said active layer;

said stripe ridge extending in a <01-1> axis direction;

said first and second cladding layers and said active layer jointly providing a region of triangular cross-section sandwiched between (111) A faces, wherein said stripe ridge has side wall surfaces composed of (110) faces, further, comprising a current block layer disposed on opposite sides of said region of triangular cross section, and further comprising a cap layer covering said region of triangular cross section.

2. A semiconductor laser according to claim 1, wherein said semiconductor substrate is made of GaAs.

* * * * *